(12) United States Patent
Youn et al.

(10) Patent No.: US 9,472,345 B2
(45) Date of Patent: Oct. 18, 2016

(54) ALUMINUM PRECURSOR, METHOD OF FORMING A THIN FILM AND METHOD OF FORMING A CAPACITOR USING THE SAME

(71) Applicant: SAMSUNG ELECTRONICS CO., LTD., Suwon-si, Gyeonggi-do (KR)

(72) Inventors: Sang-Chul Youn, Suwon-si (KR); Atsushi Sakurai, Tokyo (JP); Masako Hatase, Tokyo (JP); Youn-Joung Cho, Hwaseong-si (KR); Ji-Na Kang, Suwon-si (KR); Naoki Yamada, Tokyo (JP); Jung-Sik Choi, Seongnam-si (KR)

(73) Assignees: SAMSUNG ELECTRONICS CO., LTD., Suwon-Si, Gyeonggi-do (KR); ADEKA CORPORATION, Tokyo (JP)

( * ) Notice: Subject to any disclaimer, the term of this patent is extended or adjusted under 35 U.S.C. 154(b) by 237 days.

(21) Appl. No.: 14/176,173

(22) Filed: Feb. 10, 2014

(65) Prior Publication Data

US 2014/0242263 A1 Aug. 28, 2014

(30) Foreign Application Priority Data

Feb. 25, 2013 (KR) .......................... 10-2013-0019559

(51) Int. Cl.
| | | |
|---|---|---|
| *C07F 5/06* | (2006.01) | |
| *H01G 13/00* | (2013.01) | |
| *H01G 4/33* | (2006.01) | |
| *H01G 4/08* | (2006.01) | |
| *H01G 4/12* | (2006.01) | |
| *H01L 27/108* | (2006.01) | |
| *H01L 49/02* | (2006.01) | |

(52) U.S. Cl.
CPC ................ *H01G 4/33* (2013.01); *H01G 4/085* (2013.01); *H01G 4/1272* (2013.01); *H01L 27/10852* (2013.01); *H01L 28/40* (2013.01)

(58) Field of Classification Search
CPC ........... C07F 5/066; C07F 5/06; H01G 4/33; H01G 4/085; H01G 4/1272; H01L 27/10852
USPC ..................... 556/181, 183; 427/79, 255.28
See application file for complete search history.

(56) References Cited

U.S. PATENT DOCUMENTS

| | | | |
|---|---|---|---|
| 5,747,409 A | 5/1998 | Commereuc | |
| 5,922,405 A | 7/1999 | Kim et al. | |
| 7,077,902 B2 | 7/2006 | Vaartstra | |
| 7,563,727 B2 | 7/2009 | Goodner | |
| 8,124,179 B2 | 2/2012 | Nilsen et al. | |
| 8,470,402 B2 | 6/2013 | Dussarrat et al. | |
| 2002/0076284 A1 | 6/2002 | Kato | |
| 2011/0274878 A1 | 11/2011 | Makino et al. | |

FOREIGN PATENT DOCUMENTS

| | | |
|---|---|---|
| JP | 06-326028 A | 11/1994 |
| JP | 08-206509 A | 8/1996 |
| JP | H 11-500789 A | 1/1999 |
| JP | 2002-192404 A | 7/2002 |
| JP | 2004-015034 A | 1/2004 |
| JP | 2011-071528 A | 4/2011 |
| KR | 10-0863063 B1 | 10/2008 |
| KR | 10-0962431 B1 | 6/2010 |
| KR | 10-1072002 B1 | 10/2011 |

*Primary Examiner* — Porfirio Nazario Gonzalez
(74) *Attorney, Agent, or Firm* — Lee & Morse, P.C.

(57) ABSTRACT

An aluminum compound is represented by following Formula 1. In Formula 1, X is a functional group represented by following Formula 2 or Formula 3.

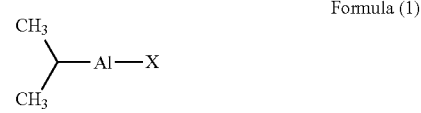

Formula (1)

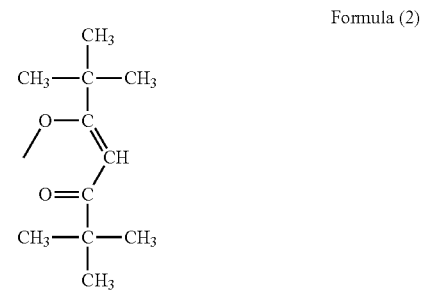

Formula (2)

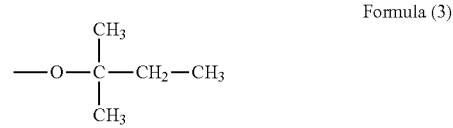

Formula (3)

20 Claims, 10 Drawing Sheets

ALUMINUM PRECURSOR, METHOD OF FORMING A THIN FILM AND METHOD OF FORMING A CAPACITOR USING THE SAME

CROSS-REFERENCE TO RELATED APPLICATION

Korean Patent Application No. 10-2013-0019559, filed on Feb. 25, 2013, in the Korean Intellectual Property Office, and entitled: "Aluminum Precursor, Method of Forming A Thin Film and Method of Forming A Capacitor Using the Same," is incorporated by reference herein in its entirety.

BACKGROUND

Example embodiments relate to an aluminum precursor, a method of forming a thin film, and a method of forming a capacitor using the same.

SUMMARY

Embodiments are directed to an aluminum compound represented by the following Formula 1,

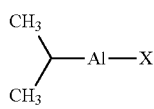

Formula (1)

wherein X is a functional group represented by the following Formula 2 or Formula 3:

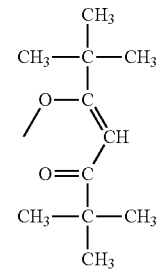

Formula (2)

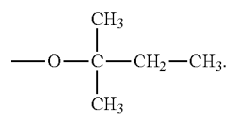

Formula (3)

Embodiments are directed to an aluminum precursor represented by the following Formula 1,

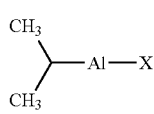

Formula (1)

wherein X is a functional group represented by the following Formula 2 or Formula 3:

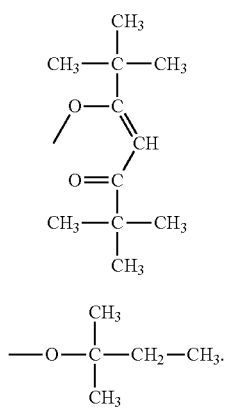

Embodiments are also directed to a method of forming a thin film including providing a deposition source onto a substrate, the deposition source including an aluminum precursor represented by the following Formula 1, and providing a reaction gas onto the substrate to react with the deposition source, Formula (1)

wherein X is a functional group represented by the following Formula 2 or the following Formula 3:

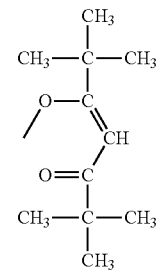

Formula (2)

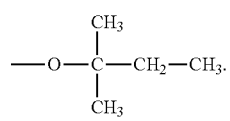

Formula (3)

The deposition source may further include a silicon precursor or an organic metal precursor.

The deposition source may be provided onto the substrate using a carrier gas including an inert gas.

The reaction gas may include at least one selected from the group of an oxidant, a reducing agent, and a nitriding agent.

The method may further include, after providing the deposition source including the aluminum precursor represented by Formula 1, performing a purging process on the substrate.

Embodiments are also directed to a method of forming a capacitor including forming a lower electrode on a substrate, forming a dielectric layer on the lower electrode using an aluminum precursor represented by the following Formula 1, and forming an upper electrode on the dielectric layer,

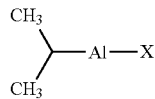

Formula (1)

wherein X is a functional group represented by the following Formula 2 or the following Formula 3:

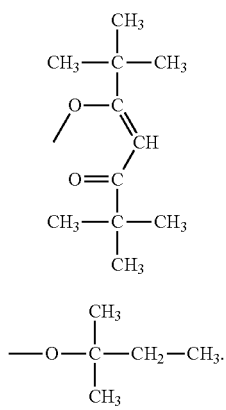

Formula (2)

Formula (3)

Forming the dielectric layer on the lower electrode using the aluminum precursor represented by Formula 1 may include providing a deposition source including the aluminum precursor onto the lower electrode, providing a reaction gas onto the lower electrode, and reacting the deposition source and the reaction gas to form a thin film on the lower electrode.

The deposition source may further include a silicon precursor or an organic metal precursor.

The reaction gas may include at least one selected from the group of an oxidant, a reducing agent, and a nitriding agent.

The method may further include, after reacting the deposition source and the reaction gas to form the thin film on the lower electrode, performing a reflow process on the substrate.

The method may further include, prior to forming the lower electrode on the substrate, forming an insulating interlayer on the substrate, and forming a contact plug through the insulating interlayer to contact a top surface of the substrate. The lower electrode may be formed on the contact plug to be electrically connected thereto.

The method may further include, prior to forming the insulating interlayer on the substrate, forming a gate structure on the substrate, and forming impurity regions at upper portions of the substrate adjacent to the gate structure. The contact plug may contact top surfaces of the impurity regions.

Forming the gate structure on the substrate may include forming a gate insulation layer pattern, a buffer layer pattern, and a gate conductive layer pattern sequentially stacked on the substrate.

Forming the lower electrode on the substrate may include forming a mold layer having an opening exposing a top surface of the contact plug on the insulating interlayer, forming a conductive layer pattern on an inner wall of the opening, and removing the mold layer.

Embodiments are also directed to a method of forming a dielectric layer including depositing a deposition source onto a substrate, the deposition source including an aluminum precursor selected from following Formulae 4 and 5, and reacting the deposition source with a reaction gas that includes at least one selected from the group of an oxidant, a reducing agent, and a nitriding agent to form a thin film including aluminum oxide and/or aluminum nitride on the substrate,

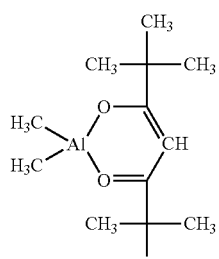

Formula (4)

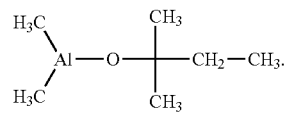

Formula (5)

The method may further include repeating the forming of the aluminum oxide and/or aluminum nitride thin film on the substrate, and performing a purging process between the forming of the aluminum oxide and/or aluminum nitride thin film on the substrate and the repeating of the forming of the aluminum oxide and/or aluminum nitride thin film.

The deposition source may further include a silicon precursor and/or an organic metal precursor having a metal other than aluminum, such that the thin film further includes silicon oxide, silicon nitride, a metal oxide other than aluminum oxide and/or a metal nitride other than aluminum nitride.

The method may further include, before or after forming the thin film including aluminum oxide and/or aluminum nitride on the substrate, forming a thin film including silicon oxide, silicon nitride, a metal oxide other than aluminum oxide and/or a metal nitride other than aluminum nitride, on the substrate, such that a multilayer dielectric film is formed.

The substrate may be a structure that includes an opening, recess, or contact hole, and the method may further include performing a reflow process after the thin film is formed.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
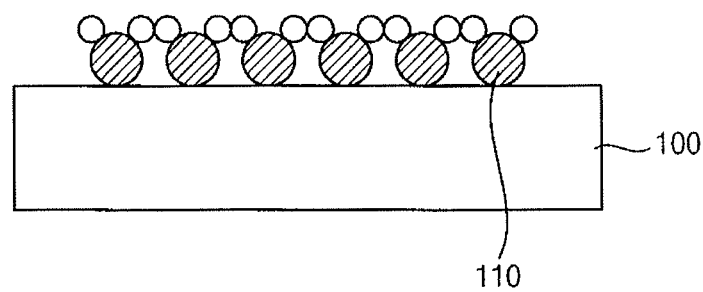
FIGS. 1 to 3 illustrate cross-sectional views depicting stages of a method of forming a thin film in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Aluminum Precursor

An aluminum precursor in accordance with example embodiments may be represented by following Formula 1. The aluminum precursor may have a low melting point, a sufficient volatility, and a high thermal stability. Thus, the aluminum precursor may serve as a deposition source in a chemical vapor deposition (CVD) process or an atomic layer deposition (ALD) process performed at a high deposition temperature.

Formula (1)

In Formula 1, X is a functional group represented by following Formula 2 or Formula 3.

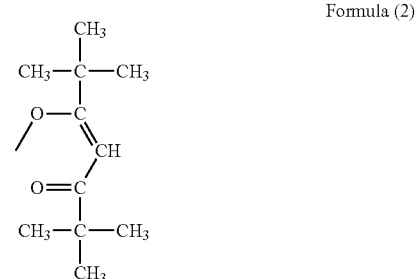

Formula (2)

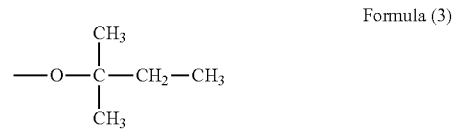

Formula (3)

The aluminum precursor may be formed by a reaction of a trialkylaluminum and an alcohol or diketonate.

In example embodiments, the aluminum precursor may be formed by a reaction of trialkylaluminum and tert-pentyl alcohol, or by a reaction of trialkylaluminum and 2,2,6,6,-tetramethyl-3,5-heptanedione (TMHD) (also referred to herein as dipivaloyl methane (DMP)).

EXAMPLE 1

Under an atmosphere of argon gas, 7.5 g of trimethylaluminum was dissolved in 115 ml of dehydrated toluene to form a solution. The solution was stirred in an ice bath and cooled to a temperature of about 10° C. 19.2 g of dehydrated dipivaloyl methane (DMP) and 30 ml of toluene were mixed to form a mixture, and the mixture was added to the cooled solution slowly for about 3 hours. Methane gas generated during the reaction was removed using argon gas. After the mixture was stirred at a room temperature for about 15 hours, the toluene was removed from the mixture at a temperature of about 100° C. and under a reduced pressure to yield a liquid residue. The liquid residue was vacuum distilled at a temperature of about 107° C. and under a pressure of about 230 Pa, and the distilled liquid residue was drained at a temperature of about 78° C. As a result, an aluminum precursor represented by following Formula 4, which was a colorless and transparent liquid, was formed.

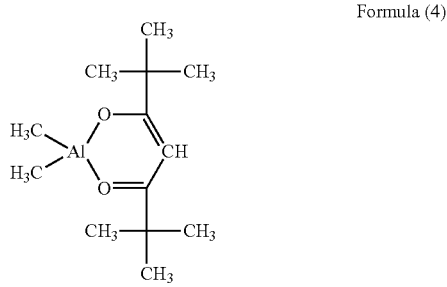

Formula (4)

EXAMPLE 2

Under an atmosphere of argon gas, 114 g of trimethylaluminum was dissolved in 1200 g of dehydrated toluene to form a solution, and the solution was stirred in an ice bath and cooled to a temperature of about 10° C. 243 g of dehydrated tert-pentyl alcohol was added to the cooled solution slowly for about 3 hours to form a mixture, and methane gas generated during the reaction was removed using argon gas. After the mixture was stirred at a room temperature for about 15 hours, the toluene was removed from the mixture at a temperature of about 120° C. and under a reduced pressure to yield a viscous liquid residue. The viscous liquid residue was vacuum distillated at a temperature of about 107° C. and under a pressure of about 50 Pa, and the distilled viscous liquid residue was drained at a temperature of about 78° C. As a result, an aluminum precursor represented by following Formula 5, which was a white solid, was formed.

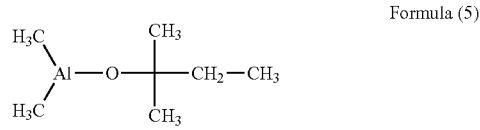

Formula (5)

Evaluation of the Ignitability of Aluminum Precursors

To evaluate the stability of aluminum precursors with respect to ignitability, aluminum precursors prepared in accordance with Examples 1 and 2, trimethylaluminum as a Comparative Example 1, an aluminum precursor represented by following Formula 6 as a Comparative Example 2, and an aluminum precursor represented by following Formula 7 as a Comparative Example 3 were left exposed to the atmosphere. The results are shown in following Table 1.

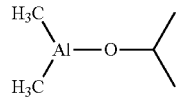

Formula (6)

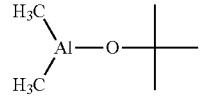

Formula (7)

TABLE 1

| Aluminum precursor | Ignitability |
|---|---|
| Example 1 | No |
| Example 2 | No |
| Comparative Example 1 | Yes |
| Comparative Example 2 | No |
| Comparative Example 3 | No |

As shown in Table 1, while the aluminum precursor in accordance with Comparative Example 1 exhibited ignitability, the aluminum precursors in accordance with Examples 1 and 2 and Comparative Examples 2 and 3 did not exhibit ignitability. Thus, it may be concluded that a thin film may be formed safely by a CVD process or an ALD process using the aluminum precursors in accordance with Examples 1 and 2 and Comparative Examples 2 and 3.

Evaluation of the Properties of Aluminum Precursors

To evaluate the suitability of the aluminum precursors as a deposition source for a CVD process or an ALD process, melting points of the aluminum precursors in accordance with Examples 1 and 2 and Comparative Examples 2 and 3 were measured by a micro-melting point measuring device. In addition, samples were heated under an atmosphere of argon gas, and temperatures of the samples were measured by a TG-DTA to determine when amounts of the samples were reduced to about 50 wt % of the original samples. The results are shown in following Table 2.

TABLE 2

| Aluminum precursor | Melting point | Temperature when amounts of samples were reduced to about 50 wt % |
|---|---|---|
| Example 1 | equal to or less than 40° C. | 145° C. |
| Example 2 | equal to or less than 40° C. | 155° C. |
| Comparative Example 2 | equal to or less than 40° C. | 129° C. |
| Comparative Example 3 | 80° C. | 135° C. |

As shown in Table 2, the aluminum precursors in accordance with Examples 1 and 2 were in liquid states at a temperature of about 40° C. Thus, these aluminum precursors have a low melting point and a high vapor pressure such that a thin film may be formed by a CVD process or an ALD using the precursors in accordance with Examples 1 and 2 with a low energy.

Evaluation of the Thermal Stability of Aluminum Precursors

To evaluate the thermal stability of aluminum precursors in accordance with a pyrolysis temperature, temperatures of the aluminum precursors in accordance with Examples 1 and 2 and Comparative Example 2 were measured by a DSC to determine when pyrolysis was generated. The results are shown in following Table 3.

TABLE 3

| aluminum precursor | pyrolysis temperature |
| --- | --- |
| Example 1 | 320° C. |
| Example 2 | 340° C. |
| Comparative Example 2 | 194° C. |

As shown in Table 3, while the aluminum precursor in accordance with Comparative Example 2 was pyrolyzed at a temperature of about 200° C., the aluminum precursors in accordance with Examples 1 and 2 were not pyrolyzed even at a temperature of about 300° C. The aluminum precursors in accordance with Examples 1 and 2 were shown to have a high thermal stability even at a temperature of greater than about 300° C. Thus, a thin film may be formed using the aluminum precursors in accordance with Examples 1 and 2 by a CVD process or an ALD process performed at a high deposition temperature.

Figure 2:
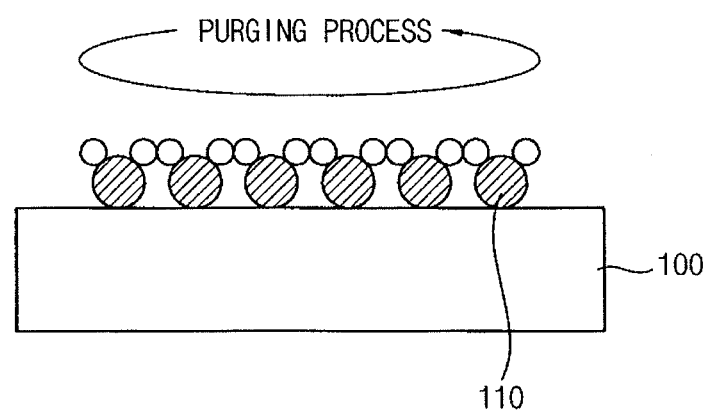
Figure 3:
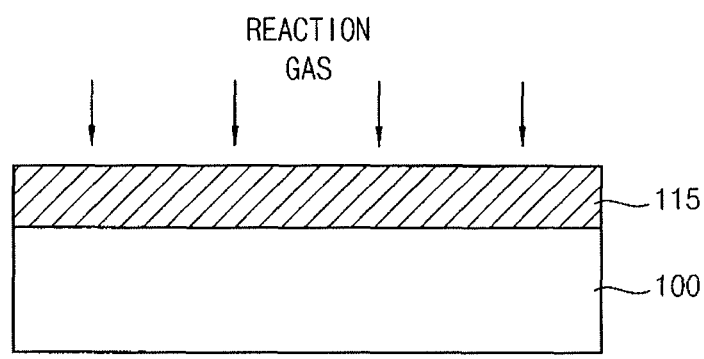

FIGS. 1 to 3 illustrate cross-sectional views depicting stages of a method of forming a thin film in accordance with example embodiments. The thin film may be formed by a CVD process or an ALD process using the aluminum precursor in accordance with example embodiments.

Referring to FIG. 1, a deposition source 110 including the aluminum precursor in accordance with example embodiments may be provided onto a substrate 100 in a chamber.

In example embodiments, the deposition source 110 may be vaporized at a temperature of about 25° C. to about 400° C., for example, at a temperature of about 250° C. to about 350° C., and provided onto the substrate 100. The aluminum precursor in accordance with example embodiments may have a low melting point and a high vapor pressure, and be stable at a high temperature, and thus the deposition source 110 may not be pyrolyzed but may be adsorbed onto the substrate 100. For example, the aluminum precursor may be the aluminum precursor in accordance with Example 1 or the aluminum precursor in accordance with Example 2.

In example embodiments, the deposition source 110 may further include a silicon precursor and/or an organic metal precursor in accordance with the type of the thin film to be formed. In this case, the aluminum precursor and the silicon precursor and/or the organic metal precursor may be vaporized, respectively, to be provided onto the substrate 100. In other implementations, the aluminum precursor and the silicon precursor and/or the organic metal precursor may be mixed to form a mixture having a proper composition, and then the mixture may be vaporized to be provided onto the substrate 100.

In example embodiments, the organic metal precursor may include a metal, e.g., titanium (Ti), zirconium (Zr), hafnium (Hf), etc., and an organic coordination compound including an alcohol compound, a glycol compound, a β-diketonate compound, a cyclopentadiene compound, an organic amine compound, and/or a combination thereof.

The term "alcohol compound" may refer to, e.g., an alkyl alcohol such as methanol, propanol, isopropyl alcohol, butanol, sec-butyl alcohol, isobutyl alcohol, tert-butyl alcohol, pentyl alcohol, isoamyl alcohol, tert-pentyl alcohol, etc., or an ether alcohol such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(methoxyethoxy)-1,1-dimethylethanol, 2-propoxy-1,1-diethylethanol, 2-2-butoxy-1,1-diethylethanol, 3-methoxy-1,1-dimethylpropanol, etc.

The term "glycol compound" may refer to, e.g., 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-propanediol, 2-ethyl-2-butyl-1,3-propanediol, 2,4-pentanediol, 2-methyl-1,3-propanediol, 2-methyl-2,4-pentanediol, 2,4-hexanediol, 2,4-diethyl-2,4-pentanediol, etc.

The term "β-diketonate compound" may refer to, e.g., an alkyl-substituted β-diketone such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-trimethylheptane-3,5-dione, octane-2,4-dione, 2,2,6-trimethyloctane-3,5-dione, 2,6-dimethyloctane-3,5-dione, 2,9-dimethylnonane-4,6-dione-2-methyl-6-ethyldecane-3,5-dione, 2,2-dimethyl-6-ethyldecane-3,5-dione, etc., a fluorine-substituted alkyl β-diketone such as 1,1,1-trifluoropentane-2,4-dione, 1,1,1-trifluoro-5,5-dimethylhexane-2,4-dione, 1,1,1,5,5,5-hexafluoropentane-2,4-dione, 1,3-diperfluorohexyl propane-1,3-dione, etc., and an ether-substituted β-diketone such as 1,1,5,5-tetramethyl-1-methoxyhexane-2,4-dione, 2,2,6,6-tetramethyl-1-methoxyheptane-3,5-dione, 2,2,6,6-tetramethyl-1-(2-methoxyethoxy)heptane-3,5-dione, etc.

The term "cyclopentadiene compound" may refer to, e.g., cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, tetramethylcyclopentadiene, etc.

The term "organic amine compound" may refer to, e.g., methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, isopropylmethylamine, etc.

In example embodiments, the deposition source 110 may include a carrier gas and/or an organic solvent.

In example embodiments, the deposition source 110 may be provided to the substrate 100 by a gas delivery system. After the deposition source 110 is heated and pressurized to be vaporized, the vaporized deposition source 110 may be provided onto the substrate 100 using a carrier gas including an inert gas such as argon, nitrogen, helium, etc.

In other implementations, the deposition source 110 may be provided to the substrate 100 by a liquid delivery system. For example, about 0.01 mol/L to about 2.0 mol/L, or, for example, about 0.05 mol/L to about 1.0 mol/L of the deposition source 110 may be dissolved in an organic solvent to form a composition, and the composition may be heated and pressurized to be vaporized. The vaporized composition may be provided onto the substrate 100 using the carrier gas.

The organic solvent may include, e.g., an acetic ester such as ethyl acetate, butyl acetate, methoxyethyl acetate, etc., an ether such as tetrahydrofuran, tetrahydropyran, ethylene glycol dimethyl ether, diethylene glycol dimethyl ether, triethylene glycol dimethyl ether, dibutyl ether, dioxane, etc., a ketone such as methyl butyl ketone, methyl isobutyl ketone, ethyl butyl ketone, dipropyl ketone, diisobutyl ketone, methyl amyl ketone, cyclohexanone, methylcyclohexanone, etc., a hydrocarbon such as hexane, cyclohexane, methylcyclohexane, dimethylcyclohexane, ethylcyclohexane, heptane, octane, toluene, xylene, etc., a hydrocarbon having a cyano functional group such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, 1,4-dicyanobenzene, etc., pyridine, lutidine, and/or a combination thereof.

In example embodiments, the deposition source 110 may not include metal impurities, halogen impurities, organic impurities, water, or particles that may affect the electrical characteristics of the thin film. When a thin film serving as a gate insulation layer or a barrier layer is formed, the deposition source 110 may not include an alkali metal, an alkaline earth metal, or a homologous element of the depositions source 110.

If such metal impurities are present, such may be included in the deposition source 110 at a concentration of equal to or less than about 100 ppb, or, for example, at a concentration of equal to or less than about 10 ppb. The total metal impurities may be included at a concentration of equal to or less than about 1 ppm, or, for example, at a concentration of equal to or less than about 100 ppb.

If halogen impurities are present, such may be included at a concentration of equal to or less than about 100 ppm, or, for example, at a concentration of equal to or less than about 10 ppm.

If organic impurities are present, such may be included at a concentration of equal to or less than about 500 ppm, or, for example, at a concentration of equal to or less than about 50 ppm.

Water may cause particles to form when the thin film is formed by a CVD process or an ALD process. Thus, water may be removed as much as possible from the silicon precursor, the metal precursor, or the organic solvent. Accordingly, if water is present, the deposition source 110 may include the water at a concentration of equal to or less than about 10 ppm, or, for example, at a concentration of equal to or less than about 1 ppm.

If particles are present in the liquid deposition source 110, such particles may be present such that an amount equal to or less than 100 particles having a size larger than about 0.3 μm is included in 1 ml of the liquid, or, for example, such that an amount equal to or less than 1,000 particles having a size larger than about 0.2 μm is included in 1 ml of the liquid. Particles may be measured by, e.g., a liquid particle counter (LPC).

Referring to FIG. 2, a purging process may be performed on the substrate 100. Accordingly, by-products and/or the deposition source 110 that are not adsorbed onto the substrate 100 but remain in the chamber, may be removed.

The purging process may be performed by exhausting an inside of the chamber using an inert gas, e.g., argon, helium, etc., and/or depressurizing the inside of the chamber.

When the inside of the chamber is exhausted using an inert gas, the inert gas may be provided into the chamber at a flow rate of about 200 sccm to about 5000 sccm, or, for example, at a flow rate of about 500 sccm to about 2000 sccm.

In other implementations, when the inside of the chamber is depressurized, a depressurizing degree may be about 0.01 PA to about 300 PA, or, for example, about 0.01 PA to about 100 PA.

Referring to FIG. 3, a reaction gas may be provided to the substrate 100 to be reacted with the deposition source 110 adsorbed on the substrate 100. Accordingly, a reactant of the reaction may be deposited on the substrate 100, and thus, a thin film 115 may be formed on the substrate 100.

The reaction gas may include, e.g., an oxidant containing oxygen, such as ozone, nitrogen dioxide, nitrogen monoxide, water vapor, hydrogen peroxide, formic acid, acetic acid, acetic anhydride, etc., a reducing agent containing hydrogen, etc., and/or a nitriding agent containing an organic amine compound such as monoalkylamine, trialkylamine, alkylenediamine, etc., hydrazine, ammonia, etc.

Accordingly, the thin film 115 formed by the reaction may include aluminum, an aluminum oxide and/or an aluminum nitride.

In example embodiments, the thin film 115 may include $AlSi_xO_y$, $ZrAl_xSiO_y$, $TiAl_xSiO_y$, or $HfAl_xSiO_y$, where x and y indicate various relative amounts.

In example embodiments, the reaction gas may react with the deposition source 110 at a temperature of about 150° C. to about 300° C. Also, energy such as plasma, light, heat, voltage, etc., may be provided to activate the reaction.

When the thin film 115 is formed by providing light and/or heat energy to the substrate 100, the reaction may be performed at a pressure in a range of an atmospheric pressure to about 10 Pa. In other implementations, when the thin film 115 is formed by providing plasma onto the substrate 100, the reaction may be performed at a pressure in a range of about 10 Pa to about 2000 Pa.

If the thin film 115 is formed at a very low deposition rate, productivity of the thin film 115 may be reduced. On the other hand, if the thin film 115 is formed at a very high deposition rate, characteristics of the thin film 115 may be deteriorated. Thus, in example embodiments, the thin film 115 may be formed at a deposition rate of about 0.01 to about 5000 nm/min, or, for example, at a deposition rate of about 0.1 to about 1000 nm/min. However, the deposition rate may vary according to desired characteristics of the thin film 115.

The deposition process for forming the thin film 115 may be performed once. In other implementations, the deposition process may be performed multiple times in accordance with a desired thickness of the thin film 115. In this case, however, a purging process may be further performed between each deposition process to remove by-products and/or remaining portions of the deposition source 110 that have not been adsorbed on the substrate 100 or have not reacted with the reaction gas.

When the thin film 115 is formed on a surface of an opening, a recess, or a contact hole, or when the thin film 115 is formed to sufficiently fill an opening, a reflow process may be further performed to increase the step coverage of the thin film 115.

As described above, the aluminum precursor may have a low melting point, a high vapor pressure, and a high thermal stability. Thus, the thin film 115 may be formed by a CVD process or an ALD process using the aluminum precursor as a deposition source.

Moreover, the deposition source 110 and the reaction gas may be properly selected in accordance with the desired characteristics of the thin film 115. A wiring and/or gate insulation layer of a semiconductor device, a dielectric layer of a capacitor, or a coating layer of an electronic components may be formed easily by the deposition process.

FIGS. 4 to 11 illustrate cross-sectional views depicting stages of a method of forming a capacitor in accordance with example embodiments.

Figure 4:
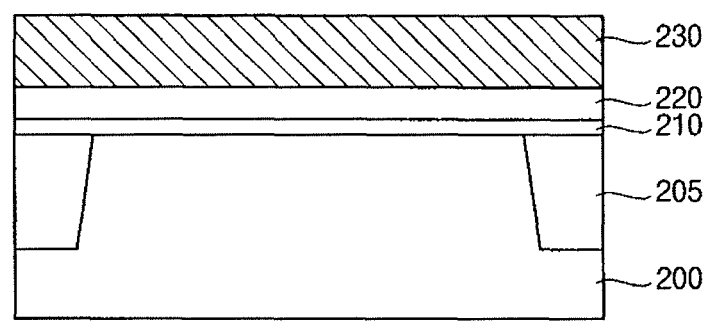
FIGS. 4 to 11 illustrate cross-sectional views depicting stages of a method of forming a capacitor in accordance with example embodiments.

Referring to FIG. 4, a gate insulation layer 210, a buffer layer 220, and a gate conductive layer 230 may be sequentially formed on a substrate 200 having an isolation layer pattern 205 thereon.

The gate insulation layer 210 may be formed on the substrate 200 and the isolation layer pattern 205 to include an insulating material, e.g., oxide, nitride, oxynitride, etc. The gate insulation layer 210 may be formed to include a metal oxide or a metal nitride using the aluminum precursor in accordance with example embodiments.

The gate conductive layer 230 may be formed by a CVD process or an ALD process. The gate conductive layer 230 may be formed to include, e.g., polysilicon doped with impurities.

The buffer layer 220 may be formed between the gate insulation layer 210 and the gate conductive layer 230 to prevent a reaction between the gate insulation layer 210 and the gate conductive layer 230. In some implementations, the process for forming the buffer layer 220 may be skipped. The buffer layer 220 may be formed to include, e.g., silicon nitride.

Figure 5:
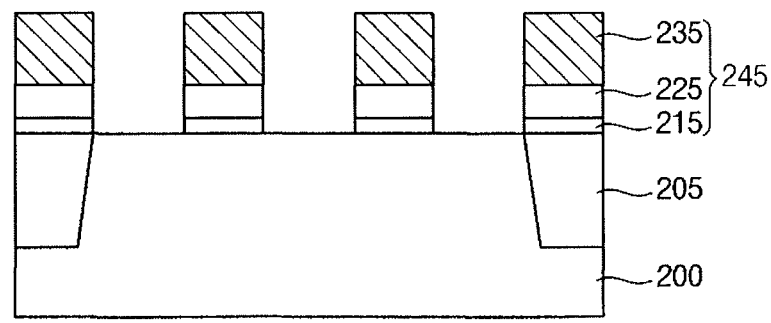

Referring to FIG. 5, the gate insulation layer 210, the buffer layer 220, and the gate conductive layer 230 may be patterned to form a gate structure 245 including a gate insulation layer pattern 215, a buffer layer pattern 225, and a gate conductive layer pattern 235 sequentially stacked.

The gate insulation layer pattern 215, the buffer layer pattern 225, and the gate conductive layer pattern may be formed by forming an etch mask on the gate conductive layer 230, and etching the gate insulation layer 210, the buffer layer 220, and the gate conductive layer 230 anisotropically using the etch mask. The etch mask may be removed by, e.g., a wet etching process after the formation of the gate insulation layer pattern 215, the buffer layer pattern 225, and the gate conductive layer pattern 235.

Figure 6:
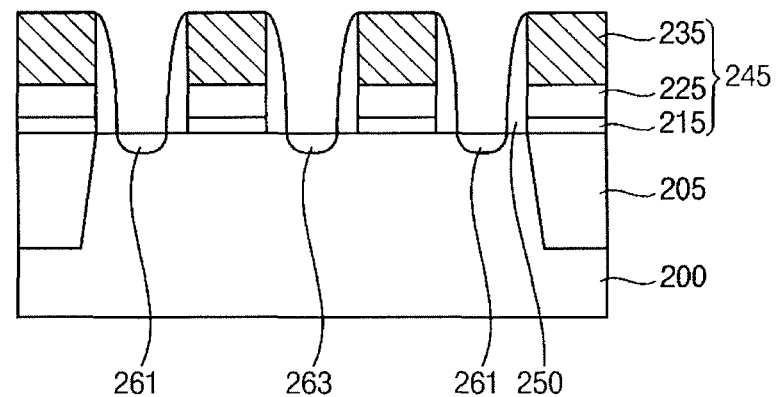

Referring to FIG. 6, a spacer 250 may be formed on a sidewall of the gate structure 245, and first and second impurity regions 261 and 263 may be formed at upper portions of the substrate 200 adjacent to the gate structure 245.

The spacer 250 may be formed by forming a spacer layer on the gate structure 245 and a top surface of the substrate 200, and etching the spacer layer anisotropically. The spacer 250 may be formed to include silicon nitride.

The substrate 200 may be doped with impurities by an ion implantation process to form the first and second impurity regions 261 and 263. The first and second impurity regions 261 and 263 and the gate structure 245 may define a transistor. The first and second impurity regions 261 and 263 may serve as source and drain regions, respectively, in the transistor.

Figure 7:
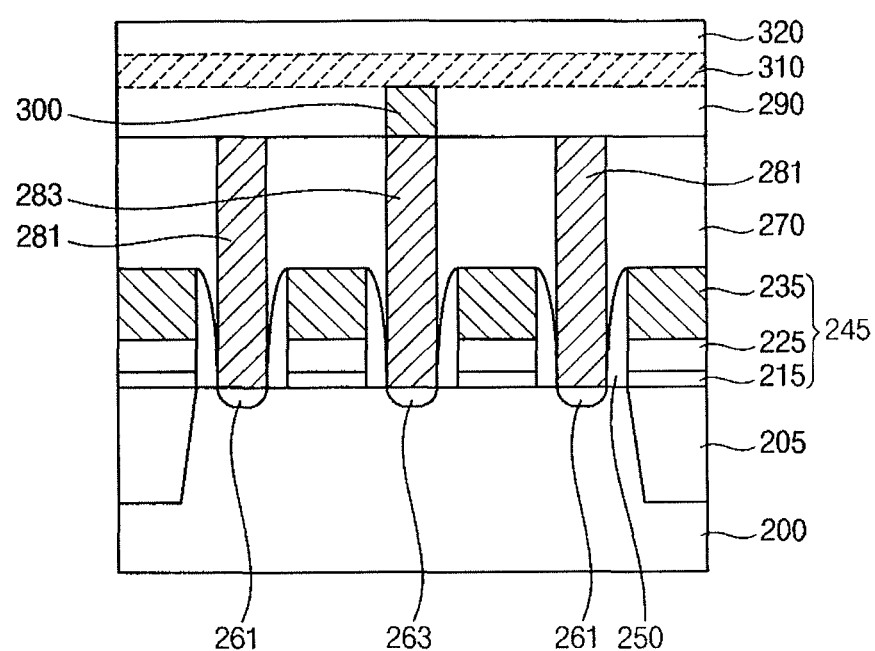

Referring to FIG. 7, a first insulating interlayer 270 may be formed on the substrate 200 to cover the transistor, and first and second contact plugs 281 and 283 may be formed through the first insulating interlayer 270 to contact the first and second impurity regions 261 and 263, respectively.

In example embodiments, the first insulating interlayer 270 may be etched to form a plurality of first openings exposing the first and second impurity regions 261 and 263 of the substrate 200, and a first conductive layer may be formed on the substrate 200 and the first insulating interlayer 270 to sufficiently fill the first openings. An upper portion of the first conductive layer may be planarized until a top surface of the first insulating interlayer 270 is exposed to form the first and second contact plugs 281 and 283. The first and second contact plugs 281 and 283 may be electrically connected to the first and second impurity regions 261 and 263, respectively.

A second insulating interlayer 290 may be formed on the first insulating interlayer 270 and on the first and second contact plugs 281 and 283. A bit line contact 300 may be formed through the second insulating interlayer 290 to contact the second contact plug 283.

In example embodiments, the second insulating interlayer 290 may be etched to form a second opening (not shown) exposing a top surface of the second contact plug 283, and a second conductive layer may be formed on the second contact plug 283 and the second insulating interlayer 290 to sufficiently fill the second opening. An upper portion of the second conductive layer may be planarized until a top surface of the second insulating interlayer 290 is exposed to form the bit line contact 300.

A third conductive layer may be formed on the second insulating interlayer 290 to contact the bit line contact 300, and may be patterned to form a bit line 310 electrically connected to the bit line contact 300. A third insulating interlayer 320 may be formed on the second insulating interlayer 290 to cover the bit line 310.

In example embodiments, the first to third insulating interlayers 270, 290, and 320 may be formed to include an insulating material, e.g., oxide, nitride, oxynitride, and the first to third conductive layers may be formed to include doped polysilicon and/or a metal.

Figure 8:
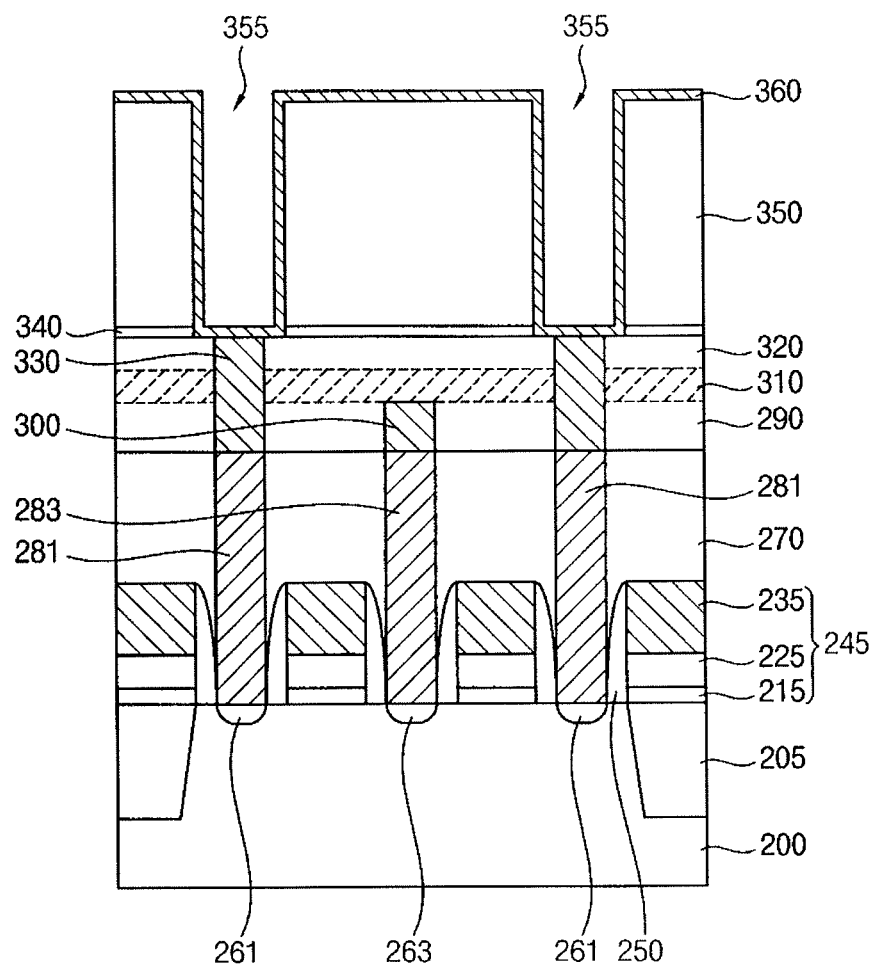

Referring to FIG. 8, a capacitor contact 330 may be formed through the second and third insulating interlayers 290 and 320 to contact a top surface of the first contact plug 281. An each stop layer 340 and a mold layer 350 may be formed sequentially on the capacitor contact 330 and the third insulating interlayer 320.

In example embodiments, the second and third insulating interlayers 290 and 320 may be etched to form a third opening exposing a top surface of the first contact plug 281, and a fourth conductive layer may be formed on the first contact plug 281 and the third insulating interlayer 320 to sufficiently fill the third opening. An upper portion of the fourth conductive layer may be planarized until a top surface of the third insulating interlayer 320 is exposed to form the capacitor contact 330.

A fourth opening 355 may be formed through the etch stop layer 340 and the mold layer 350 to expose a top surface of the capacitor contact 330. A fifth conductive layer 360 may be formed on the exposed top surface of the capacitor contact 330, a sidewall of the fourth opening 355, and the mold layer 350.

In example embodiments, the etch stop layer 340 may be formed to include silicon nitride, the mold layer 350 may be formed to include silicon oxide, and the fourth and fifth conductive layers may be formed to include doped polysilicon and/or a metal.

Figure 9:
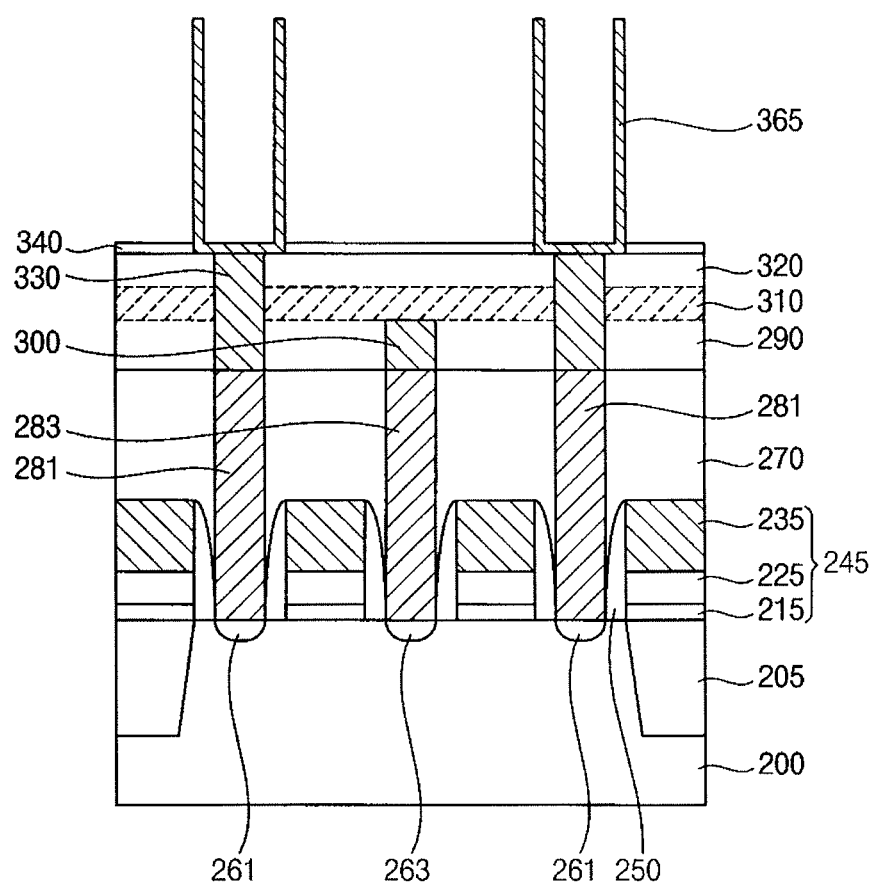

Referring to FIG. 9, a sacrificial layer may be formed on the fifth conductive layer 360 to sufficiently fill the fourth opening. The sacrificial layer and the fifth conductive layer 360 may be planarized until a top surface of the mold layer 350 is exposed to form a lower electrode 365 and a sacrificial layer pattern on the exposed top surface of the capacitor contact 330 and the sidewall of the fourth opening. The mold layer 350 and the sacrificial layer pattern may be removed by, e.g., a wet etch process. The lower electrode 365 may be formed to be electrically connected to the first contact plug 281.

Figure 10:
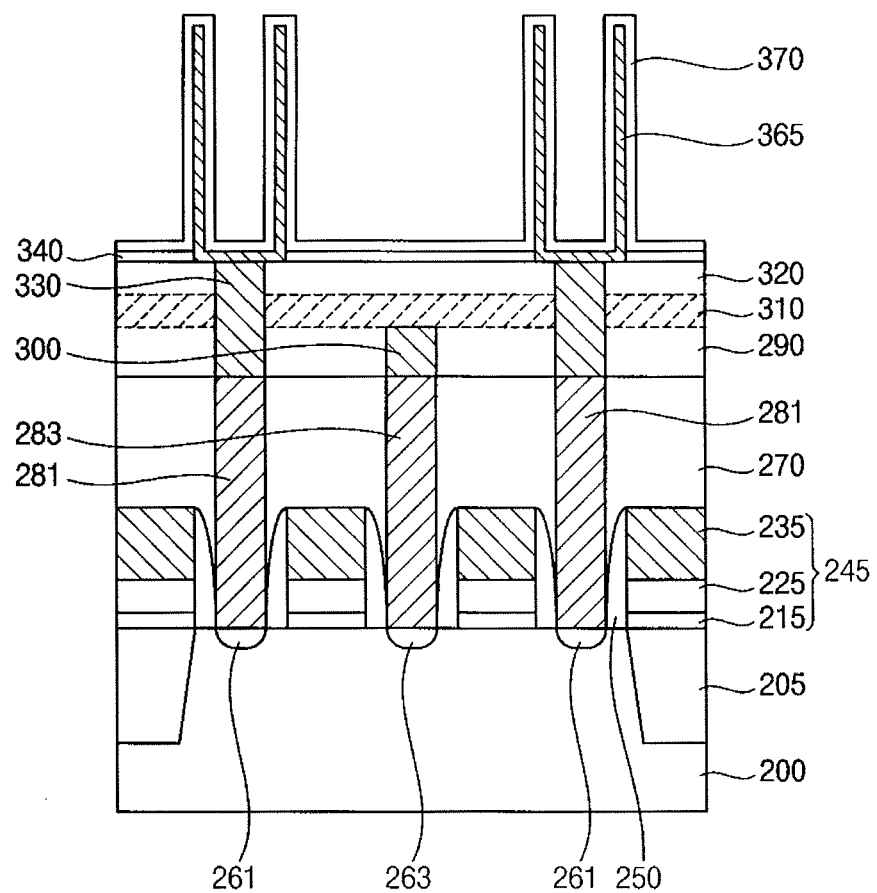

Referring to FIG. 10, a dielectric layer 370 may be formed on the lower electrode 365 and the etch stop layer 340 using the aluminum precursor in accordance with example embodiments.

The dielectric layer 370 may be formed by providing a deposition source including the aluminum precursor to the lower electrode 365 using a carrier gas including an inert gas, and providing a reaction gas onto the lower electrode 365 to react with the deposition gas.

In example embodiments, the reaction gas may include, e.g., an oxidant, a reducing agent and/or a nitriding agent.

Thus, the dielectric layer 370 may be formed to include, e.g., aluminum oxide and/or aluminum nitride to have a high dielectric constant.

The aluminum precursor may have a low melting point, a high volatility, and a high thermal stability. Thus, the deposition source including the aluminum precursor may not be pyrolyzed even at a high temperature. As a result, the dielectric layer 370 may be formed easily on the lower electrode 365 having a high aspect ratio using the deposition source.

In example embodiments, the deposition source may further include a silicon precursor and/or an organic metal precursor. Thus the dielectric layer 370 may include $AlSi_xO_y$, $ZrAl_2SiO_7$, $TiAl_2SiO_7$, or $HfAl_2SiO_7$. X may be in a range of about 0.8 to about 1.2, and y may be numbering a range of about 3.1 to about 3.9.

In example embodiments, a reflow process may be further performed on the substrate 200 to increase the step coverage of the dielectric layer 370. The reflow process may be performed at a temperature of about 250° C. to about 1,000° C., or, for example, at a temperature of about 300° C. to about 500° C.

Figure 11:
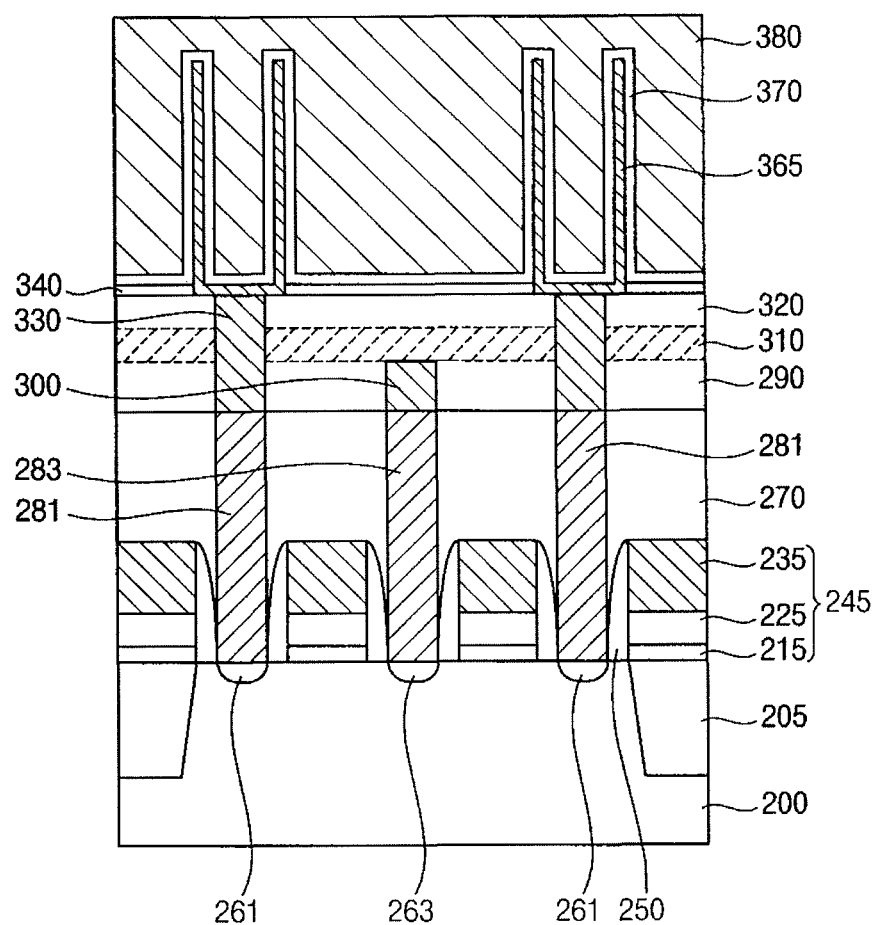

Referring to FIG. 11, an upper electrode 380 may be formed on the dielectric layer 370.

The upper electrode 380 may be formed to cover the dielectric layer 370, may include a material substantially the same as that of the lower electrode 365, e.g., doped polysilicon and/or a metal.

Figure 12:
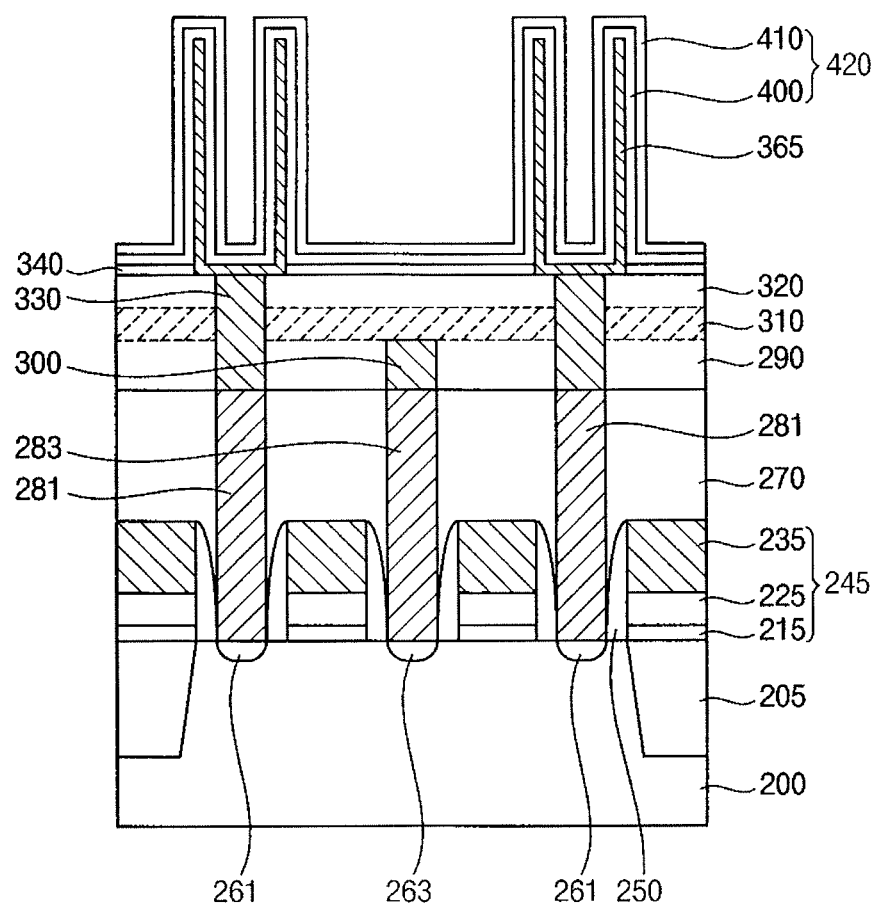
FIGS. 12 to 13 illustrate cross-sectional views depicting stages of a method of forming a capacitor in accordance with other example embodiments.
Figure 13:
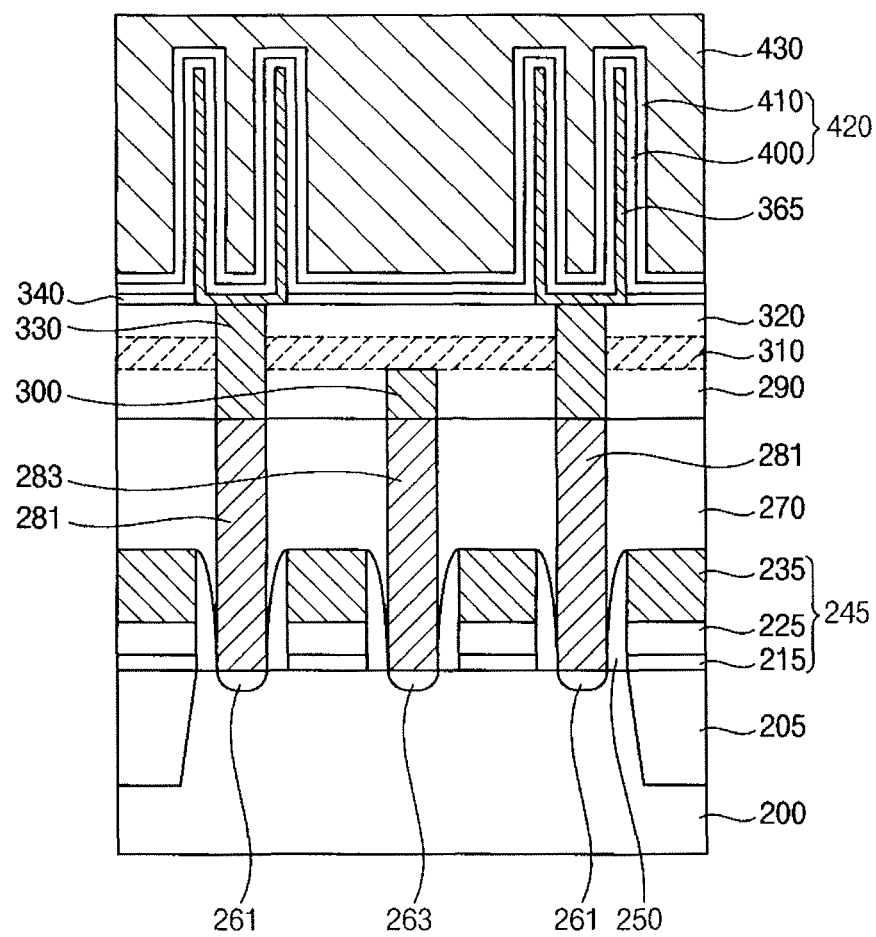

FIGS. 12 to 13 illustrate cross-sectional views depicting stages of a method of forming a capacitor in accordance with other example embodiments. This method may include processes substantially the same as or similar to those illustrated with reference to FIGS. 4 to 9 except for the formation of the dielectric layer. Thus, like reference numerals refer to like elements, and detailed explanations thereof will not be repeated.

Processes substantially the same as or similar to those illustrated with reference to FIGS. 4 to 9 may be performed. Thus, the transistor, the plurality of insulating interlayers 270, 290 and 320, the plurality of contact plugs 281 and 283, the bit line contact 300, the capacitor contact 330, the bit line 310, the etch stop layer 340 and the lower electrode 365 may be formed.

Referring to FIG. 12, a dielectric layer structure 420 including first and second dielectric layers 400 and 410 may be formed on the lower electrode 265 using the aluminum precursor in accordance with example embodiments.

The first dielectric layer 400 may be formed by providing a deposition source including the aluminum precursor to the lower electrode 365 using a carrier gas including an inert gas, and providing a reaction gas to the lower electrode 365 to react with the deposition gas.

The second dielectric layer 410 may be formed providing a deposition source including a silicon precursor and/or an organic metal precursor not containing aluminum to the first dielectric layer 400 using a carrier gas including an inert gas, and providing a reaction gas to the first dielectric layer 400 to react with the deposition gas.

In example embodiments, a purging process and a reflow process may be further performed on the substrate 200 between the formation of the first dielectric layer 400 and the formation of the second dielectric layer 410. The reflow process may be performed at a temperature of about 250° C. to about 1000° C., or, for example, at a temperature of about 300° C. to about 500° C.

The reaction gas may include, e.g., an oxidant, a reducing agent and/or a nitriding agent, and the organic metal precursor may include, e.g., zirconium (Zr), titanium (Ti), hafnium (Hf), etc. Accordingly, the first dielectric layer 400 may be formed to include aluminum oxide and/or aluminum nitride, and the second dielectric layer 410 may be formed to include silicon nitride, silicon oxide, a metal nitride not including aluminum, and/or a metal oxide not including aluminum.

In other implementations, the first dielectric layer 400 may be formed by providing a deposition source including a silicon precursor and/or an organic metal precursor not containing aluminum to the lower electrode 365 using a carrier gas including an inert gas, and providing the reaction gas to the lower electrode 365. The second dielectric layer 410 may be formed by providing a deposition source including the aluminum precursor to the first dielectric layer 400 using a carrier gas including an inert gas, and providing the reaction gas to the first dielectric layer 400.

Accordingly, the first dielectric layer 400 may be formed to include, e.g., silicon nitride, silicon oxide, a metal nitride not including aluminum, and/or a metal oxide not including aluminum, and the second dielectric layer 410 may be formed to include, e.g., aluminum oxide and/or aluminum nitride.

Referring to FIG. 13, an upper electrode 430 may be formed on the dielectric layer structure 420.

The upper electrode 430 may be formed to cover the dielectric layer structure 420, and may be formed to include a material substantially the same as that of the lower electrode 365, e.g., doped polysilicon and/or a metal.

As described above, the aluminum precursor in accordance with example embodiments may have a low melting point, a high volatility, and a high thermal stability. Thus, the dielectric layer 370 and/or the dielectric layer structure 420 may be formed on the lower electrode 365 having a high aspect ratio by a CVD process or an ALD process using the aluminum precursor as a deposition source.

By way of summation and review, due to the increase of the integration level, a thin film having a high dielectric constant and a thin thickness is desirable to form, e.g., a gate insulation layer, a dielectric layer of a capacitor, etc., and thus, the thin film may be formed using a metal oxide and/or a metal nitride. When a thin film is formed in an opening having a high aspect ratio, the thin film may not be formed easily in the opening by a physical vapor deposition (PVD) process, e.g., a sputtering process. In such a case, the thin film may be formed by a chemical vapor deposition (CVD) process or an atomic layer deposition (ALD) process.

A deposition source for the formation of the thin film may be vaporized to be provided onto a target layer as a precursor. However, the CVD process or the ALD process may be carried out at a high temperature, and thus, a general metal precursor may be pyrolyzed easily before the deposition thereof so that the thin film may not be entirely formed. Accordingly, a deposition source having a lower melting point and a high vapor pressure, and being in a liquid state to be transported is desirable. Particularly, a deposition source having a high thermal stability is desirable.

Example embodiments provide an aluminum precursor having a high thermal stability.

Example embodiments provide a method of forming a thin film using the aluminum precursor.

Example embodiments provide a method of forming a capacitor using the aluminum precursor.

According to example embodiments, the aluminum precursor represented by the Formula 1 may have a low melting point, a high vapor pressure, and a thermal stability at a high temperature, and thus the thin film may be formed by a chemical vapor deposition (CVD) process or an atomic layer deposition (ALD) process using the aluminum precursor as a deposition source.

An aluminum precursor according to embodiments may have a low melting point, a sufficient volatility, and a high thermal stability. Thus, the aluminum precursor may serve as a deposition source for the formation of the thin film in a chemical vapor deposition (CVD) process or an atomic layer deposition (ALD) process performed at a high deposition temperature. Particularly, when a dielectric layer of a capacitor is formed using the aluminum precursor as a deposition source, the aluminum precursor may not be pyrolyzed easily before the deposition, and thus the thin film may be formed evenly both on a lower electrode and an etch stop layer. Particularly, a thin film may be formed in an opening having a high aspect ratio using the aluminum precursor, so that a dielectric layer of the capacitor may be formed using the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An aluminum compound represented by the following Formula 1,

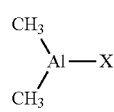

Formula 1 wherein X is a functional group represented by the following Formula 2 or Formula 3:

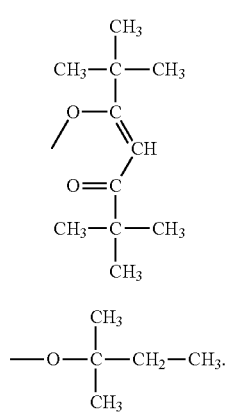

Formula 2

Formula 3

2. A method of forming a thin film, the method comprising:
   providing a deposition source onto a substrate, the deposition source including an aluminum precursor; and
   providing a reaction gas onto the substrate to react with the deposition source,
   wherein the aluminum precursor is the aluminum compound as claimed in claim 1.

3. The method as claimed in claim 2, wherein the deposition source further includes a silicon precursor or an organic metal precursor.

4. The method as claimed in claim 2, wherein the deposition source is provided onto the substrate using a carrier gas including an inert gas.

5. The method as claimed in claim 2, wherein the reaction gas includes at least one selected from the group of an oxidant, a reducing agent, and a nitriding agent.

6. The method as claimed in claim 2, further comprising, after providing the deposition source including the aluminum precursor, performing a purging process on the substrate.

7. A method of forming a capacitor, the method comprising:
   forming a lower electrode on a substrate;
   forming a dielectric layer on the lower electrode using an aluminum precursor, wherein the aluminum precursor is the aluminum compound as claimed in claim 1.

8. The method as claimed in claim 7, wherein forming the dielectric layer on the lower electrode using the aluminum precursor includes:
   providing a deposition source including the aluminum precursor onto the lower electrode;
   providing a reaction gas onto the lower electrode; and
   reacting the deposition source and the reaction gas to form a thin film on the lower electrode.

9. The method as claimed in claim 8, wherein the deposition source further includes a silicon precursor or an organic metal precursor.

10. The method as claimed in claim 8, wherein the reaction gas includes at least one selected from the group of an oxidant, a reducing agent, and a nitriding agent.

11. The method as claimed in claim 8, further comprising, after reacting the deposition source and the reaction gas to form the thin film on the lower electrode, performing a reflow process on the substrate.

12. The method as claimed in claim 7, further comprising, prior to forming the lower electrode on the substrate:
   forming an insulating interlayer on the substrate; and
   forming a contact plug through the insulating interlayer to contact a top surface of the substrate,
   wherein the lower electrode is formed on the contact plug to be electrically connected thereto.

13. The method as claimed in claim 12, further comprising, prior to forming the insulating interlayer on the substrate:
   forming a gate structure on the substrate; and
   forming impurity regions at upper portions of the substrate adjacent to the gate structure,
   wherein the contact plug contacts top surfaces of the impurity regions.

14. The method as claimed in claim 13, wherein forming the gate structure on the substrate includes forming a gate insulation layer pattern, a buffer layer pattern and a gate conductive layer pattern sequentially stacked on the substrate.

15. The method as claimed in claim 12, wherein forming the lower electrode on the substrate includes:
   forming a mold layer having an opening exposing a top surface of the contact plug on the insulating interlayer;
   forming a conductive layer pattern on an inner wall of the opening; and
   removing the mold layer.

16. A method of forming a dielectric layer, the method comprising:

depositing a deposition source onto a substrate, the deposition source including an aluminum precursor, the aluminum precursor being an aluminum compound selected from following Formulae 4 and 5; and reacting the deposition source with a reaction gas that includes at least one selected from the group of an oxidant, a reducing agent and a nitriding agent to form a thin film including aluminum oxide and/or aluminum nitride on the substrate,

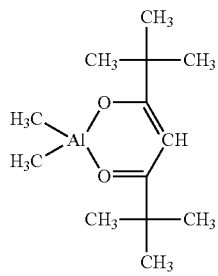

Formula (4)

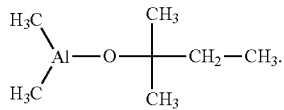

Formula (5)

17. The method as claimed in claim 16, further including;

repeating the forming of the aluminum oxide and/or aluminum nitride thin film on the substrate, and performing a purging process between the forming of the aluminum oxide and/or aluminum nitride thin film on the substrate and the repeating of the forming of the aluminum oxide and/or aluminum nitride thin film.

18. The method as claimed in claim 16, wherein the deposition source further includes a silicon precursor and/or an organic metal precursor having a metal other than aluminum, such that the thin film further includes silicon oxide, silicon nitride, a metal oxide other than aluminum oxide and/or a metal nitride other than aluminum nitride.

19. The method as claimed in claim 16, further including, before or after forming the thin film including aluminum oxide and/or aluminum nitride on the substrate, forming a thin film including silicon oxide, silicon nitride, a metal oxide other than aluminum oxide and/or a metal nitride other than aluminum nitride, on the substrate, such that a multilayer dielectric film is formed.

20. The method as claimed in claim 16, wherein the substrate is a structure that includes an opening, recess, or contact hole, and the method further includes performing a reflow process after the thin film is formed.

* * * * *